(12) United States Patent (10) Patent No.: US 8,720,052 B2
Theis et al. (45) Date of Patent: May 13, 2014

(54) METHOD FOR CONTINUOUS SINTERING ON INDEFINITE LENGTH WEBS

(75) Inventors: Daniel J. Theis, Mahtomedi, MN (US); Brian K. Nelson, Shoreview, MN (US); James N. Dobbs, Woodbury, MN (US); Samuel Kidane, St. Paul, MN (US); Ronald P. Swanson, Woodbury, MN (US); Daniel H. Carlson, Arden Hills, MN (US); Grant F. Tiefenbruck, Cottage Grove, MN (US); Karl K. Stensvad, Inver Grove Heights, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 656 days.

(21) Appl. No.: 12/993,138

(22) PCT Filed: May 20, 2009

(86) PCT No.: PCT/US2009/044603
§ 371 (c)(1),
(2), (4) Date: Nov. 17, 2010

(87) PCT Pub. No.: WO2009/143206
PCT Pub. Date: Nov. 26, 2009

(65) Prior Publication Data
US 2011/0067234 A1 Mar. 24, 2011

Related U.S. Application Data

(60) Provisional application No. 61/054,522, filed on May 20, 2008.

(51) Int. Cl.
*H01K 3/22* (2006.01)

(52) U.S. Cl.
USPC .................. 29/851; 29/831; 101/153

(58) Field of Classification Search
USPC ............... 29/846, 848, 849, 851; 101/153; 118/212, 262; 174/256; 427/99.2, 543
See application file for complete search history.

(56) References Cited

U.S. PATENT DOCUMENTS

| | | |
|---|---|---|
| 2,914,996 A | 12/1959 | Whitham |
| 3,519,253 A | 7/1970 | Aser |
| 3,529,129 A | 9/1970 | Rees |
| 3,944,783 A | 3/1976 | Donnelly |
| 4,053,277 A | 10/1977 | Bos |
| 4,278,702 A * | 7/1981 | Jenq ............................ 427/99.2 |
| 4,444,487 A | 4/1984 | Miller |
| 4,504,323 A | 3/1985 | Arai |
| 5,246,155 A | 9/1993 | Barrois |
| 5,656,081 A * | 8/1997 | Isen et al. ..................... 101/153 |
| 5,768,673 A | 6/1998 | Morigami |

(Continued)

FOREIGN PATENT DOCUMENTS

JP 2006-328479 12/2006

*Primary Examiner* — Donghai D Nguyen
(74) *Attorney, Agent, or Firm* — Adrian L. Pishko

(57) ABSTRACT

A method of applying a conductive pattern of metal onto a web of indefinite length material. This method includes applying a metal containing composition onto the web in a predefined pattern, providing a roll having a very low thermal mass, and conveying the patterned web around the roll while simultaneously applying heat energy to the metal containing composition thereby converting the metal to a conductive pattern. This allows for flexible circuitry to be fabricated in an inexpensive roll-to-roll process.

20 Claims, 2 Drawing Sheets

(56) References Cited

U.S. PATENT DOCUMENTS

| | | |
|---|---|---|
| 5,895,598 A | 4/1999 | Kitano |
| 6,340,810 B2 | 1/2002 | Yokoyama |
| 6,373,035 B1 | 4/2002 | Okamoto |
| 6,498,324 B2 | 12/2002 | Yamamoto |
| 6,498,906 B2 | 12/2002 | Kimoto |
| 6,641,513 B1 | 11/2003 | Ward |
| 6,725,010 B1 | 4/2004 | Parker |
| 6,933,479 B2 | 8/2005 | Tanaka |
| 7,194,234 B2 | 3/2007 | Katakabe |
| 7,386,936 B2 * | 6/2008 | Huhtasalo et al. .............. 29/846 |
| 2006/0057827 A1 | 3/2006 | Huhtasalo |
| 2007/0215039 A1 | 9/2007 | Edwards |

* cited by examiner

METHOD FOR CONTINUOUS SINTERING ON INDEFINITE LENGTH WEBS

The present invention is related to a method of applying a conductive pattern onto a web of indefinite length material.

BACKGROUND

There are advantages to preparing electronic circuitry on a flexible polymeric substrate. Flexible circuitry is particularly convenient for manufacturing, e.g. cellular phones and the like where space and foldability is at a premium. One of the limitations on the art's ability to prepare flexible materials bearing fine metal traces is the relatively low heat resistance of the polymeric substrate.

SUMMARY

The present invention provides a method of applying a conductive pattern of metal onto a web. In one aspect, the invention provides a method of applying a conductive pattern onto a web of indefinite length material, comprising:

applying a metal containing composition onto the web to provide a patterned web;

conveying the patterned web around a roll having a very low thermal mass;

applying heat to the patterned web to convert the metal to a conductive pattern; and cooling the conductive pattern, wherein, applying heat to the patterned web and cooling the conductive pattern are performed while conveying the patterned web around the roll.

In another aspect, the invention provides a method of applying a conductive pattern onto a web of indefinite length material, comprising:

applying a metal containing composition onto the web to provide a patterned web;

conveying the patterned web on a conveying surface comprising a contacting layer having a very low thermal mass, and applying heat to the patterned web to convert the metal to a conductive pattern; and cooling the conductive pattern, wherein, applying heat to the patterned web and cooling the conductive pattern are performed while conveying the patterned web on the conveying surface.

Unless expressly defined herein, the terminology used to describe the embodiments of the invention will be understood to have the same meaning attributed to them by those skilled in the art.

As used herein, a roll with "very low thermal mass," is defined as a roll that requires no more than about 1 joule of energy to change 1 $cm^2$ of the roll's surface by 1° K.

Those skilled in the art will more fully understand the nature of the invention upon consideration of the remainder of the disclosure, including the Detailed Description, the Examples, and the appended claims.

BRIEF DESCRIPTION OF THE DRAWINGS

In describing the embodiments of the invention, reference is made to the various Figures in which the features of the depicted embodiments are identified with a reference numeral with like reference numerals indicating like structures and wherein.

DETAILED DESCRIPTION

The invention provides a method for applying a metal containing composition to the surface of a web in a predefined pattern, conveying the web over a roll or a belt or a functionally equivalent conveying substrate having a very low thermal mass while simultaneously applying intense heat to the metal containing composition to convert the metal in the composition to a conductive pattern. The substrate is heated and cooled quickly to avoid distortion even when the substrate is kept in continuous motion at commercially viable line speeds.

Figure 1:
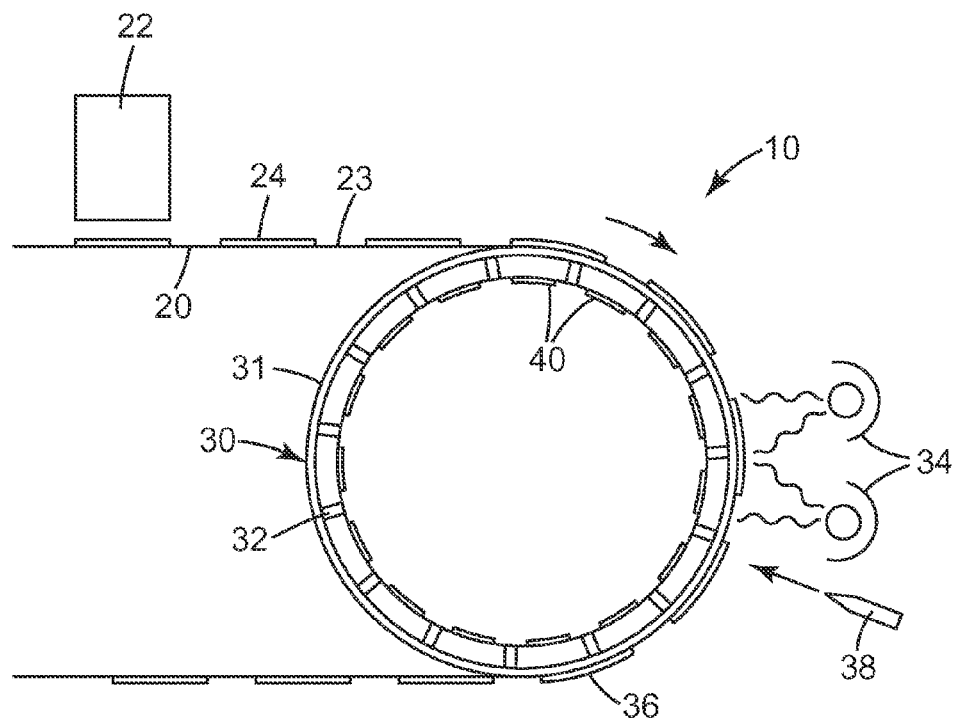
FIG. 1 is a schematic view of an apparatus for carrying out a method according to the present invention.

Referring to FIG. 1, a schematic view of an apparatus 10 for carrying out the method of the present invention is illustrated. A continuous web 20 of indefinite length is conveyed past applying station 22 where a metal containing composition 24 is applied onto a first major surface 23 of the web 20 in a predefined pattern. Web 20 can be made of any of a variety of materials. In some embodiments, web 20 is a polymeric material selected from the group polyethylene terephthalate (PET), polyethylene naphthalate (PEN), polycarbonate, and polyimide. In embodiments of the invention, applying station 22 is a device capable of performing a printing technique to apply metal containing composition 24 to the surface 23 of web 20. In some embodiments, the applying station 22 performs ink jet printing (e.g., station 22 is an ink jet printer). In other embodiments, applying station 22 applies the metal containing composition 24 by offset printing, or by rotating screen printing, or by flex gravure printing, or the like. Other techniques for the application of the metal containing composition are contemplated within the scope of the invention.

Continuous web 20 travels around roll 30 in a single direction as indicated by the directional arrow in FIG. 1. Roll 30 has a very low thermal mass. In the embodiment of the invention illustrated in FIG. 1, the very low thermal mass of roll 30 is provided by mounting a thin metal shell 31 on an air bearing 32. The selection of material for thin metal shell 31 is significant in providing roll 30 with a very low thermal mass. In some embodiments thin metal shell 31 is composed primarily of nickel. In other embodiments, other thin metallic materials can be used. In some embodiments, the thin metal shell is composed of nickel having a thickness of between about 5 mils (0.127 mm) and 15 mils (0.381 mm). Air bearing 32 comprises a non-rotating steel core. The roll 30 is constructed to require less than 1.0 joule of energy to change 1 $cm^2$ of the surface of the roll by 1° K. In some embodiments, the roll 30 requires less than 0.5 joule of energy to change 1 $cm^2$ of the roll's surface by 1° K. In some embodiments, the roll 30 requires less than 0.2 joule of energy to change 1 $cm^2$ of the roll's surface by 1° K.

Metal containing composition 24 is applied to the surface 23 of web 20 and is conveyed around the roll 30. Heat is applied to the metal containing composition 24 by heaters 34 to initiate a sintering process that converts the metal in the metal containing composition 24 to provide a final conductive pattern 36. In embodiments of the invention, heaters 34 are radiant heaters. In some embodiments, heaters 34 are infrared (IR) heaters. Other types of radiant heaters may also be used in the invention as well as resistance heaters, convection heaters, induction heaters and the like as known by those skilled in the art.

Following heating with heaters 34, the web 20 is immediately cooled below its glass transition temperature ($T_g$) prior to the separation of the web 20 from the roll 30. Cooling of the web 20 is accomplished using a quenching system 38 mounted downstream from heaters 34 and adjacent to the outer surface of the thin metal shell 30. In the depicted embodiment, quenching system 38 comprises at least one air knife. Those skilled in the art will appreciate that other devices such as nozzles or other gases may be suitable for use in the quenching system 38.

In some embodiments, heater 34 may be capable of providing heat energy at a rate sufficient to buckle thin metal shell 30 due to localized thermal expansion. As a preventative measure, embodiments of the invention are equipped to preheat thin metal shell 31 to an elevated temperature so that the additional heat provided to the surface of the metal shell 31 by heater 34 will not induce local expansion forces that exceed the thin shell's buckling force threshold. In some embodiments, a baseline heating device is provided for warming thin metal shell 31 to a predetermined baseline temperature or to a temperature within a predetermined range of temperatures. In some embodiments, baseline heating device is provided in the form shown in FIG. 1, i.e. as a plurality of resistance heaters 40 mounted inside the air bearing 32. Other configurations for a baseline heating device are also contemplated and will be appreciated by those skilled in the art.

Figure 1A:
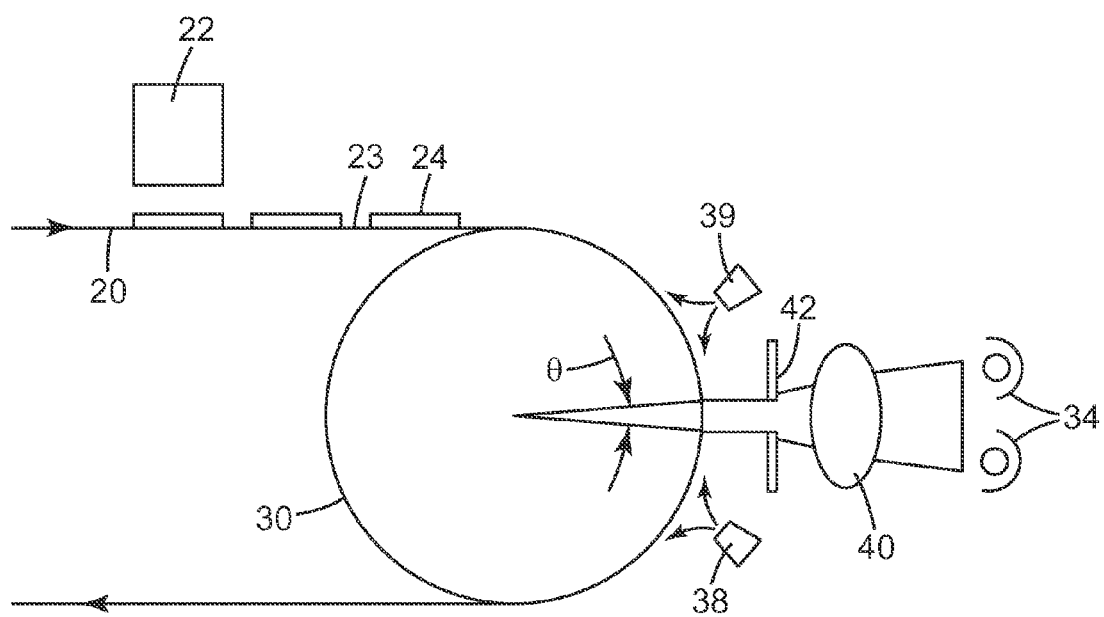
FIG. 1a is a schematic view of an alternate embodiment of the apparatus of FIG. 1.

Mathematical modeling of the apparatus of FIG. 1 has suggested that within limits, narrowing the band over which the heating occurs can further reduce the tendency for the web 20 to buckle. With this in mind, FIG. 1a illustrates an alternate embodiment of the apparatus of FIG. 1 showing certain expedients for reducing the width of the heated zone. In this embodiment the output of heaters 34 is shown focused by a lenticular lens 40 and constrained by an aperture 42 on a narrow section of the web. Other expedients that may be used in this way will suggest themselves to the ordinary artisan. By the use of these expedients, the energy is directed to a narrowed section of the web 20 as it is conveyed around thin shell 30, designated in the Figure by angle θ. By way of one or more of these expedients, the angle θ can be advantageously restrained to an arc of less than 2 degrees of the circumference of the thin shell 30. It is contemplated that in some embodiments a second quenching system 39 might optionally be present to further constrain the zone in which the heating occurs.

In some embodiments, it has been observed that the ambient humidity near the apparatus can have an impact on the process window when following the method according to the present invention. While not wishing to be bound by any theory, it is believed that the moisture content of the tiny amount of air entrained where the web 20 first contacts the roll 30 may interfere with good contact between the web and the roll when subjected to rapid heating thereby affecting the heat transfer rate. In some embodiments to improve the results, the ambient relative humidity in which the method is conducted can be less than 30%, less than 25%, or even less than 20%.

Figure 2:
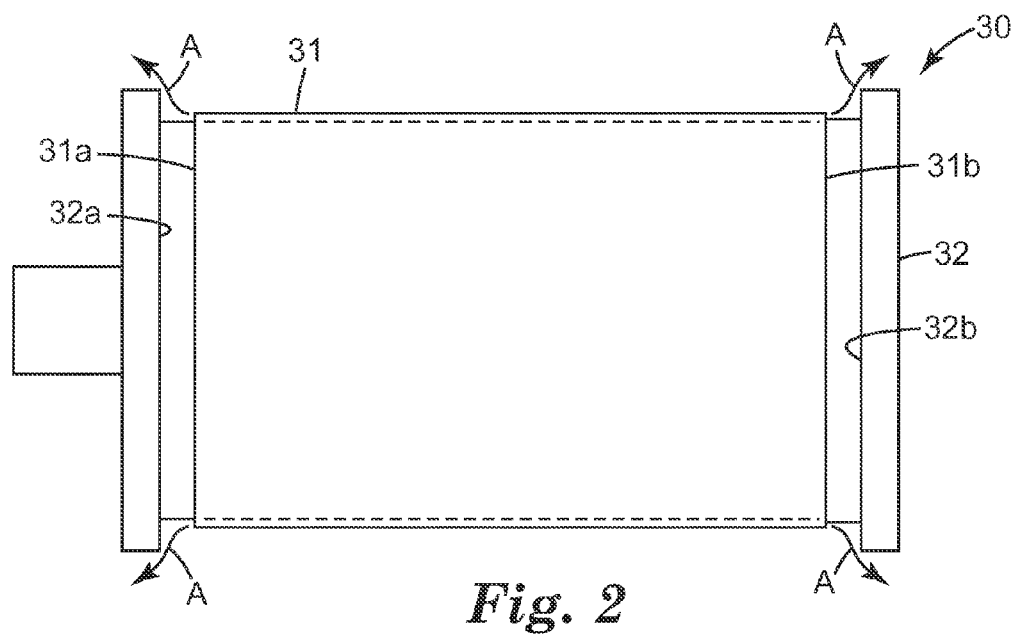
FIG. 2 is a front view of a portion of the apparatus of FIG. 1.

Referring to FIG. 2, a front view of the roll 30 of FIG. 1 is shown with thin metal shell 31 mounted on air bearing 32. Typically, the air bearing 32 comprises a cylindrical core having a plurality of holes arranged about the core's periphery, a first circular end cap, and a second circular end cap. A source of compressed gas is supplied to the cylindrical supporting core, which flows out of the holes thereby allowing for rotation of the thin metal shell 31 about the core. Airflow from the air bearing 32 emerging from the lateral edges 31a and 31b of the thin shell 31 is indicated by arrows "A." The width of the thin shell 31 is such that the shell fits within the lateral edges 32a and 32b of air bearing 32. In the depicted embodiment, thin shell 30 may "wander" laterally, at least to some extent, within the confines of the lateral edges 32a and 32b of air bearing 32.

Figure 2A:
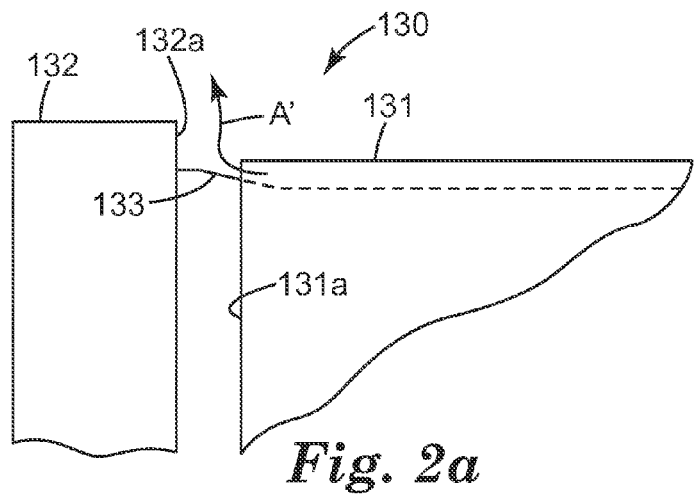
FIG. 2a is a partial front view of a roll apparatus for carrying out a method according to another embodiment of the present invention.

Referring now to FIG. 2a, a sectional view of another embodiment of a roll 130 useful in the present invention is shown and will now be described. As described in the foregoing embodiment, thin metal shell 131 is mounted on air bearing 132. Airflow from the air bearing 132 emerges from underneath the metal shell 131 along the lateral edges of the shell as indicated by arrows "A'." The width of the thin shell 131 is such that it the shell fits within the lateral edges of air bearing 132. Tapered shoulder 133 is provided on the cylindrical core near lateral edge 132a of air bearing 132. It will be appreciated that a similar tapered shoulder is provided on the opposite side (not shown) of air bearing 132. In this manner, tapered shoulder 133 prevents thin metal shell 131 from laterally wandering between the edges of air bearing 132 and serves to balance forces exerted by lateral airflow A' emerging from the edges of the thin shell 131, thus keeping the thin shell centered on the air bearing.

Figure 2B:
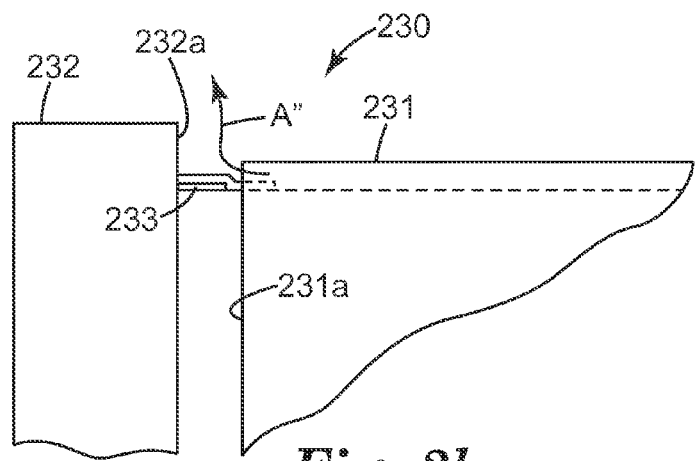
FIG. 2b is a partial front view of a roll apparatus for carrying out a method according to still another embodiment of the present invention.

Referring now to FIG. 2b, a sectional view of another embodiment of a roll 230 useful in the present invention is shown and will now be described. Thin metal shell 231 is mounted on air bearing 232. Airflow from the air bearing 232 emerges from underneath the metal shell 231 along the lateral edge 231a of the shell as indicated by arrows "A"." The width of the thin shell 231 is such that it the shell fits within the lateral edges of air bearing 232. Stepped shoulder 233 is provided on the cylindrical core near lateral edge 232a of air bearing 232. It will be appreciated that a similar structure is provided on the opposite side (not shown) of air bearing 232. In this manner, stepped shoulder 233 prevents thin metal shell 231 from laterally moving between the edges of air bearing 132, serving to balance the forces exerted by lateral airflow A" emerging from lateral edges of the thin shell 231, keeping thin shell centered within the edges of the air bearing.

In the foregoing embodiments, the shoulder structures depicted as tapered shoulder 133 (FIG. 2a) and stepped shoulder 233 (FIG. 2b) are exemplary of structures useful in the present invention to prevent excessive lateral movement of the thin metal shell within the confines of the air bearing. Other structures are contemplated within the scope of the invention to perform the same function and achieve the same result as the shoulders 133 and 233, and the invention is not to be construed as limited in any respect to the depicted shoulder structures.

Additionally, the invention is not to be construed as limited to a conveying surface in the form of a roll comprised of an air bearing and a thin metal shell. Alternate conveying surfaces are contemplated such as, for example, an endless metallic belt in place of a roll described. Further, the ordinary artisan will recognize that it is possible to provide a conveying surface where only a thin contacting layer has a very low thermal mass, that contacting layer being thermally isolated from the rest of the conveying surface by, e.g. a layer of very thermally insulating material disposed immediately below the contacting layer. The foregoing alternative constructions are explicitly considered to be within the scope of the present invention.

EXAMPLE 1

An experimental set-up was prepared similar to that depicted in FIG. 1, with an axial position stabilizing mechanism generally as depicted in FIG. 2c. A web of indefinite length polyethylene terephthalate (PET), 8 inches (20.3 cm) wide and 0.005 inch (0.127 mm) thick, commercially available as ST504 film from DuPont of Wilmington, Del., was threaded up. The roll included a thin shell of primarily nickel, 8.658 inches (21.906 cm) in diameter and 0.010 inch (0.254 mm) thick, commercially available as Nickel Sleeve from Stork Prints America of Charlotte, N.C. A shell of this composition requires approximately 0.1 joule of energy to change 1 cm$^2$ of the roll's surface by 1° K.

The nickel shell was mounted around a non-rotating steel supporting core serving as an air bearing. This non-rotating steel supporting core was fitted with 15-65 watt strip heaters (commercially available as Thermofoil heaters from Minco of Minneapolis, Minn.) attached to the inner diameter of the core as baseline heaters. The heat control for the baseline heaters included resistance thermal detector (RTD) feedback to allow for three specific heat zone settings of the core. The supporting air supply for the thin shell acted to transfer heat from the core to the shell as the air passed through holes provided in the steel core. Air pressure of 40 inches of water (0.10 kg/cm$^2$) was provided to the core to support the shell. It was noted that at these settings, the normal temperature differential between the core temperature and the surface of the nickel shell was on the order of 10° C., although it will be noted that this observation was a general guideline, and that the steady state temperature differential when running the web is a function of the web thickness and width as well as line speed.

An ink composition containing silver nanoparticles suspended in a vehicle (commercially available as CCI-300 from Cabot Corporation of Albuquerque, Minn.) was dispensed in a predetermined pattern onto the web from an ink jet printing station commercially available as Model SE128 from Dimatix of Lebanon, N.H. while the web was being advanced at a line speed of 4 feet/minute (1.22 m/min). A heater was provided in the form of two 1600 watt IR heaters (commercially available as lamp and holder model 5193-16-SP735 from Research Inc. of Minneapolis, Minn.). The IR heaters were fitted with parabolic reflectors to focus the energy to an approximately 0.5 inch wide cross web line. Power to the IR heaters was controlled with a power controller cabinet (model 910-A-240-40-00, Research Inc.). The infrared wavelength of this apparatus was primarily between 1 and 2 microns, which equates to a bulb "temperature" of about 1000 to 2000° C. Exposure of the ink composition to the radiation caused the silver nanoparticles to sinter into a conductive layer of silver which was cooled with a quenching system provided in the form of an air knife positioned downstream from the IR heaters, essentially as shown in FIG. 1 and described elsewhere herein. During operation, the PET web was not thermally distorted and the nickel shell did not buckle.

EXAMPLE 2

An experimental set-up was prepared similar to that of Example 1, except as follows. The 1600 watt IR heaters and their focusing and controlling hardware were replaced by a 1500 watt, 25-50 kHz induction heater. This induction heater coil having a 1 inch (2.54 cm) diameter was positioned a distance of 2 mm from the thin shell, and the film was advanced at a speed of 2 feet/min (0.61 m/min). Exposure of the ink composition to the heat generated by the induction heater caused the silver nanoparticles to sinter into a conductive layer of silver which was cooled with a quenching system provided in the form of an air knife positioned downstream from the induction heating coil as described elsewhere herein. During operation, the PET web was not thermally distorted and the nickel shell did not buckle.

While the invention has been particularly shown and described with reference to various embodiments thereof, it will be understood by those skilled in the art that various other changes in the form and details may be made therein without departing from the spirit and scope of the invention.

What is claimed is:

1. A method of applying a conductive pattern onto a web of indefinite length material, comprising:
    applying a metal containing composition onto the web to provide a patterned web;
    conveying the patterned web around a roll having a very low thermal mass;
    applying heat to the patterned web to convert the metal to a conductive pattern;
    cooling the conductive pattern; and
    wherein, the applying heat to the patterned web and cooling the conductive pattern are performed while conveying the patterned web over and around a surface of the roll.

2. The method according to claim 1 wherein the roll comprises a thin metal shell mounted on an air bearing.

3. The method according to claim 2 wherein the thin metal shell is primarily composed of nickel.

4. The method according to claim 3 wherein the thin metal shell is between about 5 mils (0.127 mm) and 15 mils (0.381 mm) thick.

5. The method according to claim 4 wherein the air bearing supports the thin metal shell around a non-rotating core.

6. The method according to claim 2 further comprising a baseline heating device for maintaining the thin metal shell at a predetermined baseline temperature.

7. The method according to claim 1 wherein applying heat to the patterned web is accomplished with an infrared energy source.

8. The method according to claim 5 wherein the infrared energy source is focused by a lens on a section of the web while the web is being conveyed around the roll.

9. The method of claim 8 wherein the lens comprises a lenticular lens and an aperture is positioned between the lenticular lens and the web.

10. The method according to claim 1 wherein the web comprises a film comprising a polymer selected from the group consisting of polyethylene terephthalate, polyethylene naphthalate, polycarbonate, and polyimide.

11. The method according to claim 2 wherein the cooling the conductive pattern comprises cooling the web below the glass transition temperature of the web while conveying the patterned web around the roll.

12. The method according to claim 11 wherein the cooling is accomplished using a quenching system mounted adjacent to an outer surface of the thin metal shell.

13. The method according to claim 12 wherein the quenching system comprises at least one air knife.

14. The method according to claim 1 wherein the metal containing composition comprises silver particles suspended in a vehicle, and wherein the applying heat to the patterned web sinters the silver particles into the conductive pattern.

15. The method according to claim 1 wherein the roll requires less than 0.5 joule of energy to change 1 cm$^2$ of the roll's surface by 1° K.

16. The method according to claim 1 wherein the roll requires less than 0.2 joule of energy to change 1 cm$^2$ of the roll's surface by 1° K.

17. The method according to claim 1 wherein applying heat to the patterned web is performed over an arc of no greater than 2 degrees of the circumference of the roll.

18. The method according to claim 1 wherein applying heat to the patterned web is accomplished with an inductive energy source.

19. The method according to claim 1 wherein the ambient relative humidity during the applying heat to the patterned web is less than 30%.

20. A method of applying a conductive pattern onto a web of indefinite length material, comprising:
- applying a metal containing composition onto the web to provide a patterned web;
- conveying the patterned web on a conveying surface comprising a contacting layer having a very low thermal mass;
- applying heat to the patterned web to convert the metal to a conductive pattern;
- cooling the conductive pattern; and wherein, the applying heat to the patterned web and cooling the conductive pattern are performed while conveying the patterned web on the contacting layer of the conveying surface.

* * * * *

UNITED STATES PATENT AND TRADEMARK OFFICE
CERTIFICATE OF CORRECTION

| | | |
|---|---|---|
| PATENT NO. | : 8,720,052 B2 | Page 1 of 1 |
| APPLICATION NO. | : 12/993138 | |
| DATED | : May 13, 2014 | |
| INVENTOR(S) | : Daniel Theis | |

It is certified that error appears in the above-identified patent and that said Letters Patent is hereby corrected as shown below:

In the Claims:

Column 6,
Line 39, in Claim 8, delete "claim 5" and insert -- claim 7 --, therefor.

Signed and Sealed this
Nineteenth Day of August, 2014

Michelle K. Lee
*Deputy Director of the United States Patent and Trademark Office*